(12) United States Patent
Meng et al.

(10) Patent No.: US 11,522,151 B2
(45) Date of Patent: Dec. 6, 2022

(54) ORGANIC LIGHT-EMITTING DEVICE

(71) Applicant: National Chiao Tung University, Hsinchu (TW)

(72) Inventors: Hsin-Fei Meng, Hsinchu (TW); Sheng-Fu Horng, Hsinchu (TW); Yu-Chiang Chao, Taoyuan (TW); Chih-Yu Chang, Taipei (TW); Yu-Fan Chang, Guanxi Township, Hsinchu County (TW); Mei-Peng Liou, New Taipei (TW); Qian-Wei Lin, Taipei (TW); Hsiao-Tso Su, Chiayi (TW); Chiung-Wen Chang, Chiayi (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 575 days.

(21) Appl. No.: 16/260,720

(22) Filed: Jan. 29, 2019

(65) Prior Publication Data

US 2019/0355921 A1 Nov. 21, 2019

(30) Foreign Application Priority Data

May 18, 2018 (TW) .................. 107117120

(51) Int. Cl.
*H01L 51/00* (2006.01)
*H01L 51/50* (2006.01)

(52) U.S. Cl.
CPC ........ *H01L 51/508* (2013.01); *H01L 51/0059* (2013.01); *H01L 51/5056* (2013.01);
(Continued)

(58) Field of Classification Search
CPC ................................... H01L 51/5072
See application file for complete search history.

(56) References Cited

U.S. PATENT DOCUMENTS

| | | | |
|---|---|---|---|
| 6,525,466 B1 * | 2/2003 | Jabbour | H01L 51/5221 313/504 |
| 6,803,720 B2 | 10/2004 | Kwong et al. | |

(Continued)

FOREIGN PATENT DOCUMENTS

| | | |
|---|---|---|
| CN | 106660947 A | 5/2017 |
| JP | 2000173774 A | 6/2000 |

(Continued)

OTHER PUBLICATIONS

Sun, D. et al., Arylsilanes and siloxanes as optoelectronic materials for organic light-emitting diodes (OLEDs), J Mater. Chem. C, Jun. 4, 2015, 3, 9496 (Year: 2015).*

(Continued)

*Primary Examiner* — Sean M DeGuire
(74) *Attorney, Agent, or Firm* — Muncy, Geissler, Olds & Lowe, P.C.

(57) ABSTRACT

An organic light-emitting device includes a first electrode layer, an emission layer, an electron transporting layer, an electron injection layer, and a second electrode layer sequentially formed from bottom to top. The emission layer includes a guest light-emitting material, a first phenyl phosphine oxide derivative and a hole transporting material. The electron transporting layer includes a second phenyl phosphine oxide derivative and a third phenyl phosphine oxide derivative different from the second phenyl phosphine oxide (Continued)

derivative. One of the second phenyl phosphine oxide derivative and the third phenyl phosphine oxide derivative is identical to the first phenyl phosphine oxide derivative. The electron injection layer includes an alkaline metal compound.

12 Claims, 2 Drawing Sheets

(52) U.S. Cl.
CPC ...... *H01L 51/5092* (2013.01); *H01L 51/5012* (2013.01); *H01L 51/5016* (2013.01); *H01L 2251/5384* (2013.01)

(56) References Cited

U.S. PATENT DOCUMENTS

| | | | | |
|---|---|---|---|---|
| 2002/0045061 | A1* | 4/2002 | Hosokawa | H01L 51/5016 428/690 |
| 2007/0108893 | A1* | 5/2007 | Lee | H01L 51/5012 313/504 |
| 2012/0068168 | A1* | 3/2012 | Lee | C07F 9/5728 257/40 |
| 2014/0197401 | A1* | 7/2014 | Kroeber | H01L 51/56 257/40 |
| 2016/0322568 | A1* | 11/2016 | Fadhel | C07F 9/64 |
| 2017/0170411 | A1 | 6/2017 | Wallikewitz et al. | |

FOREIGN PATENT DOCUMENTS

| | | |
|---|---|---|
| JP | 2010045222 A | 2/2010 |
| JP | 2016051901 A | 4/2016 |
| TW | 201637261 A | 10/2016 |
| TW | 201721928 A | 6/2017 |

OTHER PUBLICATIONS

Jeon, S. O., et al., High-Efficiency Deep-Blue-Phosphorescent Organic Light-Emitting Diodes using a Phosphinie Oxide adn a Phosphine Sulfide High-Triplet-Energy Host Material with Bipolar Charge-Transport Properties, Adv. Mater, Apr. 21, 2010, 22, 1872-1876. (Year: 2010).*

Aziz et al., Degratation Mechanism of Small Molecule-Based Organic Light-Emitting Devices, Science, Mar. 19, 1999, pp. 1900-1902, vol. 283, American Association for the Advacement of Science, Washington, DC, 3 pages.

Yoo et al., Efficiency enhancement of blue phosphorescent organic light-emitting diodes using mixed electron transport layer, Optical Materials, Nov. 20, 2014, pp. 21-25, vol. 39, Elsevier, 5 pages.

* cited by examiner

ORGANIC LIGHT-EMITTING DEVICE

This application claims priority for Taiwan patent application no. 107117120 filed on May 18, 2018, the content of which is incorporated by reference in its entirely.

BACKGROUND OF THE INVENTION

Technical Field

The present invention relates to an organic light-emitting device. More particularly, the invention relates to an organic light-emitting device including the electron transporting layer having two different phenyl phosphine oxide derivatives.

Description of Related Art

Recently, the organic light-emitting diode (OLED) gets attention owing to its high luminance, rapid refresh rate, wide color gamut and so on. All the characteristics make the OLED become more suitable for the applications of portable display as well as solid-state lighting.

Generally, as illustrated in FIG. 1, the organic emitting device includes an anode 10, hole injection layer 12, hole transporting layer 14, emission layer 16, electron transporting layer 18, electron injection layer 20 and the cathode 22 and is processed via the vacuum deposition or coating. The anode 10 injects holes and the cathode 22 injects the electrons into several organic layers. The holes injected migrate into the emission layer 16 after passing through the hole transporting layer 14. The electrons migrate into the emission layer 16 after passing through the electron transporting layer 18. Within the emission layer 16, the electrons and the holes combine to generate the excitons, which excite the molecules of the emission layer 16 to emit the lights. However, the current OLED device has a multi-layer structure. A great number of carriers accumulate in each of interfaces among the organic semiconductor layers because of the different energy barriers among each layer and the effects of interfaces. Further, the life time of the current OLED device shortened because of the increased consumption and the decreased recombination rate. To solve this problem for avoiding the accumulation of the carriers is to remove the electron transporting layer 18 of the OLED device. Nowadays, via a solution-processed OLED having a large area, the cost is reduced. However, dark spots are generated after a period of operation time and further cause the point defects to shorten the life time of the current OLED device. The reason causing the point defects is assumed that alkaline metal compounds of the electron injection layer 20 diffuse into the emission layer 16 during operation.

Thus, according to the prior art, an organic light-emitting device is disclosed in the present invention to solve the problems.

BRIEF SUMMARY OF THE INVENTION

The present invention provides an organic light-emitting device. The phenyl phosphine oxide derivatives of the emission layer and the electron transporting layer are identical so that the energy band of the emission layer and the electron transporting layer are the same. Hence, the electron transporting layer can prevent the ions of the alkaline metal compound of the electron injection layer from diffusing into the emission layer. Thus, the electric leakage can be prevented and the capability of transporting electrons can be improved. Further, the possibility of the carrier accumulation in the interfaces among heterogeneous layers can be reduced.

In order to achieve the purpose, an organic light-emitting device disclosed in the present invention includes a first electrode layer, an emission layer, an electron transporting layer, an electron injection layer and a second electrode layer sequentially formed from bottom to top. The emission layer includes a guest light-emitting material, a first phenyl phosphine oxide derivative and a hole transporting material. The electron transporting layer includes a second phenyl phosphine oxide derivative and a third phenyl phosphine oxide derivative different from the second phenyl phosphine oxide derivative. One of the second phenyl phosphine oxide derivative and the third phenyl phosphine oxide derivative is identical to the first phenyl phosphine oxide derivative. The electron injection layer includes an alkaline metal compound.

One embodiment of the present invention is that the first phenyl phosphine oxide derivative, the second phenyl phosphine oxide derivative or the third phenyl phosphine oxide derivative is selected from 3-(diphenylphosphoryl)-9-[4-(diphenylphosphoryl)phenyl]-9H-carbazole (PPO21), 2,7-bis(diphenylphosphoryl)-9-phenyl-9H-carbazole (PP027), 2,7-bis(diphenylphosphoryl)-9,9'-spirobi[fluorene] (SPPO13), Di(9,9-spirobifluoren-2-yl)-phenyl-phosphine oxide (Dspiro-PO), diphenyl(4-(triphenylsilyl)phenyl)phosphine oxide (TSPO1), or 9-(3,5-bis(diphenylphosphoryl)phenyl)-9H-carbazole (CzPO2).

One embodiment of the present invention is that the alkaline metal compound of the electron injection layer is cesium fluoride.

One embodiment of the present invention is that a material of the first electrode layer and the second electrode layer is indium tin oxide (ITO). the hole transporting material is 4,4',4"-Tri(9-carbazoyl)triphenylamine (TCTA). the guest light-emitting material is a phosphorescent material or a fluorescent material.

One embodiment of the present invention is that the emission layer includes 0.5-20 wt. % (percent by weight) of the guest light-emitting material and 80-99.5 wt. % of the first phenyl phosphine oxide derivative and the hole transporting material. For instance, the ratio by weight of the first phenyl phosphine oxide derivative to the hole transporting material is not less than 1; the ratio by weight of the second phenyl phosphine oxide derivative to the third phenyl phosphine oxide derivative is not less than 1.

One embodiment of the present invention is that the organic light-emitting device further includes a hole injection layer and a hole transporting layer. The hole injection layer is disposed on the first electrode layer and located between the first electrode layer and the emission layer. The hole transporting layer is disposed on the hole injection layer and located between the hole injection layer and the emission layer.

One embodiment of the present invention is that the material of the hole injection layer is poly(3,4-ethylenedioxythiophene)/poly(4-styrenesulfonate) (PEDOT:PSS). The material of the hole transporting layer is Poly(9,9-di-n-octylfluorene-alt-(1,4-phenylene-((4-sec-butyl phenyl) imino)-1,4-phenylene (TFB).

The features and advantages of the present invention are detailed hereinafter with reference to the preferred embodiments. The detailed description is intended to enable a person skilled in the art to gain insight into the technical contents disclosed herein and implement the present invention accordingly. In particularly, a person skilled in the art can easily understand the objects and advantages of the present invention by referring to the disclosure of the specification, the claims, and the accompanying drawings.

DETAILED DESCRIPTION OF THE INVENTION

Figure 1:
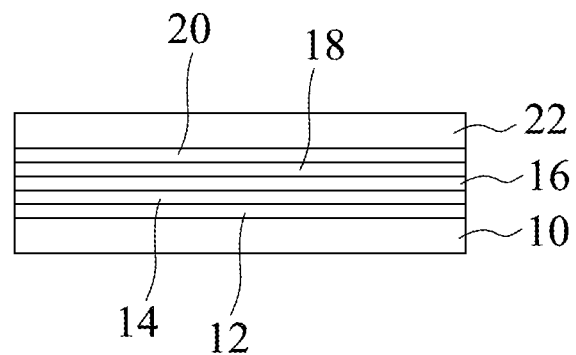
FIG. 1 illustrates a cross-sectional view of the OLED of the prior art.

The embodiments of the present invention will be further illustrated by the following associated drawings. Possibly, the same numbers will be used throughout the drawings and the description to refer to the same or like parts. In the drawings, the shapes and thicknesses may be exaggerated based on simplification and ease of labeling. It is to be understood that elements not specifically shown in the drawings or described in the specification are in a form well known to those skilled in the art. The skilled in the art can make various changes and modifications based on the contents of the present invention.

Figure 2:
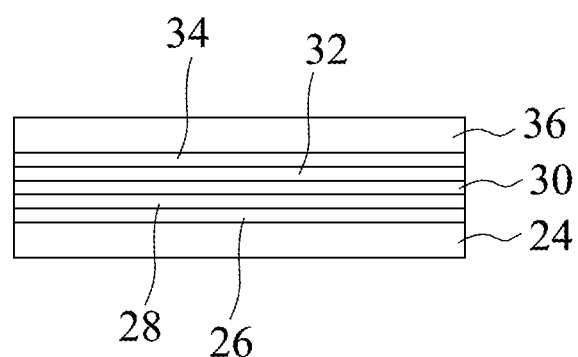
FIG. 2 illustrates a cross-sectional view of the OLED of the present invention.
Figure 3:
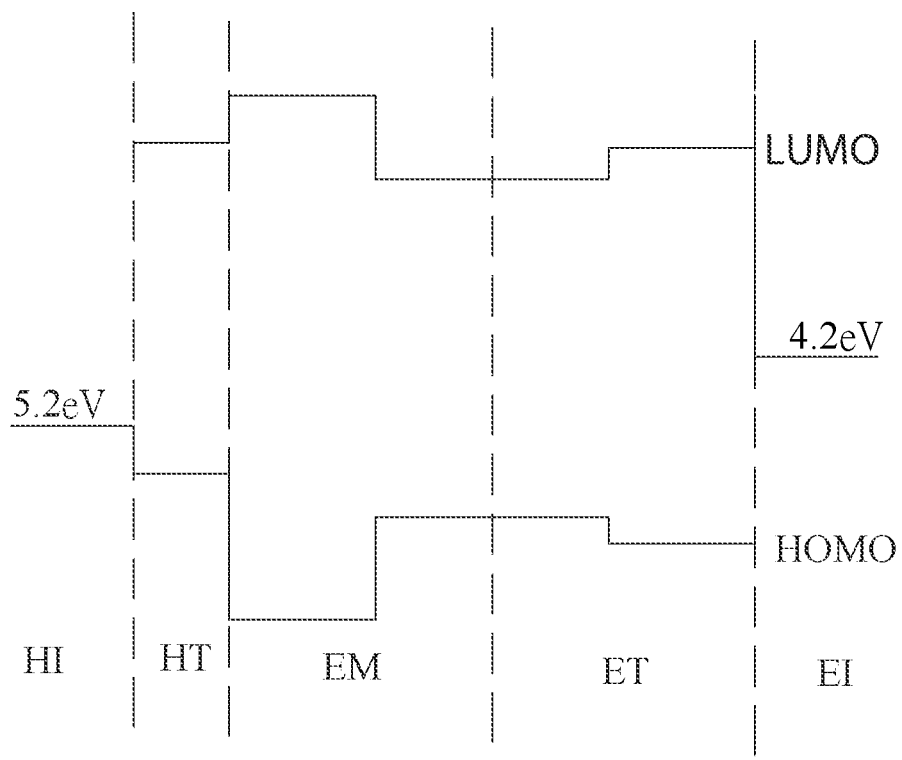
FIG. 3 illustrates a diagram of the energy bands of the hole injection layer, the hole transporting layer, emission layer, electron transporting layer and electron injection layer.

Referring to FIG. 2 and FIG. 3, an organic lighting-emitting device of the present invention is disclosed. The organic lighting-emitting device includes a first electrode layer 24, a hole injection layer 26, a hole transporting layer 28, an emission layer 30, an electron transporting layer 32, an electron injection layer 34 and a second electrode layer 36, wherein the first electrode layer 24 and the second electrode layer 36 serve as the anode and the cathode respectively. The material of the first electrode layer 24 and the second electrode layer 36 can be indium tin oxide (ITO). The hole injection layer 26 is disposed on the first electrode layer 24. The hole transporting layer 28 is disposed on the hole injection layer 26. The emission layer 30 is disposed above the first electrode layer 24 through the hole injection layer 26 and the hole transporting layer 28, that is, the hole injection layer 26 is located between the first electrode layer 24 and emission layer 30 and the hole transporting layer 28 is located between the hole injection layer 26 and the emission layer 30. The material of the hole injection layer 26 is poly(3,4-ethylenedioxythiophene)/poly(4-styrene-sulfonate) (PEDOT:PSS). The material of the hole transporting layer 28 is Poly(9,9-di-n-octylfluorene-alt-(1,4-phe-nylene-((4-sec-butyl phenyl)imino)-1,4-phenylene (TFB). The emission layer 30 includes a guest light-emitting material, a first phenyl phosphine oxide derivative and a hole transporting material. Practically, the emission layer 30 includes 0.5-20 wt. % of the guest light-emitting material and 80-99.5 wt. % of the first phenyl phosphine oxide derivative and the hole transporting material. The ratio by weight of the first phenyl phosphine oxide derivative to the hole transporting material is not less than 1. In this embodiment, for instance, the ratio by weight of the first phenyl phosphine oxide derivative to the hole transporting material is 1 and the hole transporting material is 4,4',4"-Tri(9-carbazoyl)triphenylamine (TCTA). The guest light-emitting material is a phosphorescent material or a fluorescent material.

The electron transporting layer 32 includes a second phenyl phosphine oxide derivative and a third phenyl phosphine oxide derivative, wherein the third phenyl phosphine oxide derivative is different from the second phenyl phosphine oxide derivative. The electron transporting layer 32 is disposed on the emission layer 30. One of the second phenyl phosphine oxide derivative and the third phenyl phosphine oxide derivative is identical to the first phenyl phosphine oxide derivative of the emission layer 30. The ratio by weight of the second phenyl phosphine oxide derivative to the third phenyl phosphine oxide derivative is not less than 1. For instance, the ratio by weight of the second phenyl phosphine oxide derivative to the third phenyl phosphine oxide derivative is 1 and the first phenyl phosphine oxide derivative, the second phenyl phosphine oxide derivative or the third phenyl phosphine oxide derivative is selected from 3-(diphenylphosphoryl)-9-[4-(diphenylphosphoryl)phenyl]-9H-carbazole (PPO21), 2,7-bis(diphenylphosphoryl)-9-phe-nyl-9H-carbazole (PPO27), 2,7-bis(diphenylphosphoryl)-9,9'-spirobi[fluorene] (SPPO13), Di(9,9-spirobifluoren-2-yl)-phenyl-phosphine oxide (Dspiro-PO), diphenyl(4-(triphenylsilyl)phenyl)phosphine oxide (TSPO1), or 9-(3,5-bis(diphenylphosphoryl)phenyl)-9H-carbazole (CzPO2). The energy levels of the highest occupied molecular orbital and lowest unoccupied molecular orbital of the PPO21 are 6.22 eV and 2.68 eV respectively. The energy levels of triplet energy level, the highest occupied molecular orbital and lowest unoccupied molecular orbital of the SPPO13 are 2.73 eV, 6.56 eV and 2.91 eV respectively. The energy levels of the highest occupied molecular orbital and lowest unoccupied molecular orbital of the Dsiro-PO are 6.55 eV and 2.37 eV respectively. The energy levels of triplet energy level, the highest occupied molecular orbital and lowest unoccupied molecular orbital of the TSPO1 are 3.36 eV, 6.25 eV and 2.75 eV respectively. The energy levels of the highest occupied molecular orbital and lowest unoccupied molecular orbital of the CzPO2 are 5.58 eV and 2.34 eV respectively.

The chemical structural formula of the phenyl phosphine oxide derivative is illustrated as Formula (I) below:

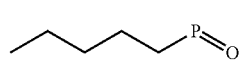

Formula (I)

The phenyl phosphine oxide derivative has wide energy band, high triplet energy level and stable thermal stability and has good solubility and electron-absorption ability in most common organic solvents. Meanwhile, the phenyl phosphine oxide derivative has excellent chemical modification to serve as the central structure to bond with different functional groups and to serve as the modifiable group to bond with different functional groups as well. That is the reason why the phenyl phosphine oxide derivative is a good electron transporting material having excellent capability of transporting the carriers. Besides, this kind of material of the electron transporting layer 32 can be dissolved in the alcohols for certain degree. The solution-processed-formed organic film has excellent morphology so that it is not easy to crystallize or to form point defects. Meanwhile, the excellent film formation is also helpful for the stability of the device.

The electron injection layer 34 includes an alkaline metal compound. The electron injection layer 34 is disposed on the electron transporting layer 32. The second electrode layer 36 is disposed on the electron injection layer 34. In this embodiment, the material of the electron injection layer 34 is cesium fluoride.

The energy bands of the hole injection layer 26, the hole transporting layer 28, the emission layer 30, the electron transporting layer 32 and the electron injection layer 34 are illustrated in FIG. 3. The energy bands of the hole injection layer 26, the hole transporting layer 28, the emission layer 30, the electron transporting layer 32 and the electron injection layer 34 are represented as HI, HT, EM, ET and EI. The work functions of the hole injection layer 26 and the electron injection layer 34 are 5.2 eV and 4.2 eV respectively. The lowest unoccupied molecular orbital (LUMO) and the highest occupied molecular orbital (HOMO) are represented as the upper energy level and the lower energy level of the hole transporting layer 28, emission layer 30 and the electron transporting layer 32. The emission layer 30 and the electron transporting layer 32 have the same energy bands owing to including the identical phenyl phosphine oxide derivative. Thus, the electron transporting layer 32 can prevent the ions of the alkaline metal compound of the electron injection layer 34 from diffusing into the emission layer 30 so that the electric leakage can be prevented. Meanwhile, the capability of transporting electrons can be improved and the possibility of the carrier accumulation in the interfaces among heterogeneous layers can be reduced.

In the present invention, the solution-processed red emitting phosphorescence diode includes an organic light-emitting diode having an electron transporting layer made via a single material. Another organic light-emitting diode having an electron transporting layer made via two different phenyl phosphine oxide derivatives. Comparing to the operation stability of these organic light-emitting diodes, at an initial luminance of 100 cd/m2, the half-lifetime of the electron transporting layer made via a single material is 3.5 hours and the half-lifetime of the electron transporting layer made via two different phenyl phosphine oxide derivatives is 245 hours. Apparently, the half-lifetime of the electron transporting layer made via two different phenyl phosphine oxide derivatives is 70 times comparing to the half-lifetime of the electron transporting layer made via a single material Accordingly, the phenyl phosphine oxide derivatives of the emission layer and the electron transporting layer are identical so that the energy band of the emission layer and the electron transporting layer are the same. Hence, the electron transporting layer can prevent the ions of the alkaline metal compound of the electron injection layer from diffusing into the emission layer. Meanwhile, the electric leakage can be prevented and the capability of transporting electrons can be improved. Further, the possibility of the carrier accumulation in the interfaces among heterogeneous layers can be reduced.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. An organic light-emitting device, comprising:
   a first electrode layer;
   an emission layer, disposed on the first electrode layer and comprising a guest light-emitting material, a first phenyl phosphine oxide derivative and a hole transporting material;
   an electron transporting layer, disposed on the emission layer and comprising a second phenyl phosphine oxide derivative and a third phenyl phosphine oxide derivative different from the second phenyl phosphine oxide derivative, and one of the second phenyl phosphine oxide derivative and the third phenyl phosphine oxide derivative is identical to the first phenyl phosphine oxide derivative;
   an electron injection layer, disposed on the electron transporting layer and comprising an alkali metal compound; and
   a second electrode layer, disposed on the electron injection layer;
   wherein the first phenyl phosphine oxide derivative is 3-(diphenylphosphoryl)-9-[4-(diphenylphosphoryl) phenyl]-9H-carbazole (PPO21) or diphenyl(4-(triphenyl silyl)phenyl)phosphine oxide (TSPO1).

2. The organic light-emitting device of claim 1, wherein the second phenyl phosphine oxide derivative or the third phenyl phosphine oxide derivative is selected from 3-(diphenylphosphoryl)-9-[4-(diphenylphosphoryl)phenyl]-9H-carbazole (PPO21), 2,7-bis(diphenylphosphoryl)-9-phenyl-9H-carbazole (PPO27), 2,7-bis(diphenylphosphoryl)-9,9'-spirobi[fluorene] (SPPO13), Di(9,9-spirobifluoren-2-yl)-phenyl-phosphine oxide (Dspiro-PO), diphenyl(4-(triphenyl silyl)phenyl)phosphine oxide (TSPO1), or 9-(3,5-bis(diphenylphosphoryl)phenyl)-9H-carbazole (CzPO2).

3. The organic light-emitting device of claim 1, wherein the alkali metal compound is cesium fluoride.

4. The organic light-emitting device of claim 1, wherein a material of the first electrode layer and the second electrode layer is indium tin oxide (ITO).

5. The organic light-emitting device of claim 1, wherein the hole transporting material is 4,4',4"-Tri(9-carbazoyl) triphenylamine (TCTA).

6. The organic light-emitting device of claim 1, wherein the emission layer comprises 0.5-20 wt. % (percent by weight) of the guest light-emitting material and 80-99.5 wt. % of the first phenyl phosphine oxide derivative and the hole transporting material.

7. The organic light-emitting device of claim 6, wherein a ratio by weight of the first phenyl phosphine oxide derivative to the hole transporting material is not less than 1.

8. The organic light-emitting device of claim 1, wherein a ratio by weight of the second phenyl phosphine oxide derivative to the third phenyl phosphine oxide derivative is not less than 1.

9. The organic light-emitting device of claim 1, further comprising:
   a hole injection layer, disposed on the first electrode layer and located between the first electrode layer and the emission layer; and
   a hole transporting layer, disposed on the hole injection layer and located between the hole injection layer and the emission layer.

10. The organic light-emitting device of claim 9, wherein a material of the hole injection layer is poly(3,4-ethylenedioxythiophene)/poly(4-styrenesulfonate) (PEDOT:PSS).

11. The organic light-emitting device of claim 9, wherein a material of the hole transporting layer is Poly(9,9-di-n-octylfluorene-alt-(1,4-phenylene-((4-sec-butyl phenyl) imino)-1,4-phenylene (TFB).

12. The organic light-emitting device of claim 1, wherein the guest light-emitting material is a phosphorescent material or a fluorescent material.

* * * * *